United States Patent
Lu et al.

(10) Patent No.: US 10,636,789 B2
(45) Date of Patent: Apr. 28, 2020

(54) TRANSISTOR WITH LOW RESISTIVITY CARBON ALLOY

(71) Applicant: QUALCOMM Incorporated, San Diego, CA (US)

(72) Inventors: Ye Lu, San Diego, CA (US); Junjing Bao, San Diego, CA (US); Bin Yang, San Diego, CA (US); Lixin Ge, San Diego, CA (US); Yun Yue, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 185 days.

(21) Appl. No.: 15/663,602

(22) Filed: Jul. 28, 2017

(65) Prior Publication Data

US 2018/0342513 A1 Nov. 29, 2018

Related U.S. Application Data

(60) Provisional application No. 62/511,795, filed on May 26, 2017.

(51) Int. Cl.
*H01L 29/06* (2006.01)
*H01L 27/092* (2006.01)
(Continued)

(52) U.S. Cl.
CPC ........... *H01L 27/092* (2013.01); *H01L 21/78* (2013.01); *H01L 21/823814* (2013.01);
(Continued)

(58) Field of Classification Search
CPC ........... H01L 27/092; H01L 21/823878; H01L 21/823814; H01L 29/0649; H01L 29/4966; H01L 29/1606; H01L 21/78; H01L 29/045; H01L 29/42392
See application file for complete search history.

(56) References Cited

U.S. PATENT DOCUMENTS 9,356,155 B2   5/2016   Sandhu
9,607,899 B1   3/2017   Cheng et al.
(Continued)

FOREIGN PATENT DOCUMENTS

WO   2016200971 A1   12/2016
WO   2017049887 A1   3/2017

OTHER PUBLICATIONS

Zou Z., et al., "Uniform Single-Layer Graphene Growth on Recyclable Tungsten Foils," Nano Research, Jan. 28, 2015, vol. 8, No. 2, pp. 592-599.

(Continued)

*Primary Examiner* — Cuong B Nguyen
*Assistant Examiner* — Samuel Park
(74) *Attorney, Agent, or Firm* — Qualcomm Incorporated/Seyfarth Shaw LLP

(57) ABSTRACT

A complementary metal-oxide-semiconductor (CMOS) transistor may include a first semiconductor structure and a gate stack on the first semiconductor structure. The gate stack may include a gate dielectric layer on the first semiconductor structure, a work function material on the gate dielectric layer, and a gate metal fill material on the work function material of the gate stack. The gate metal fill material may include a low resistivity carbon alloy. A dielectric fill material may be included on the gate stack.

26 Claims, 10 Drawing Sheets

(51) Int. Cl.
    *H01L 29/78*    (2006.01)
    *H01L 29/49*    (2006.01)
    *H01L 29/66*    (2006.01)
    *H01L 21/78*    (2006.01)
    *H01L 21/8238*  (2006.01)
    *H01L 29/04*    (2006.01)
    *H01L 29/16*    (2006.01)
    *H01L 29/423*   (2006.01)

(52) U.S. Cl.
    CPC .... *H01L 21/823878* (2013.01); *H01L 29/045* (2013.01); *H01L 29/0649* (2013.01); *H01L 29/1606* (2013.01); *H01L 29/42392* (2013.01); *H01L 29/4908* (2013.01); *H01L 29/4966* (2013.01); *H01L 29/66795* (2013.01); *H01L 29/7856* (2013.01)

(56) References Cited

U.S. PATENT DOCUMENTS

| | | | |
|---|---|---|---|
| 9,728,621 B1* | 8/2017 | Cheng | H01L 29/4983 |
| 9,768,072 B1 | 9/2017 | Cheng | |
| 2007/0023839 A1 | 2/2007 | Furukawa et al. | |
| 2007/0257325 A1* | 11/2007 | Rachmady | H01L 29/66795 257/401 |
| 2008/0303096 A1* | 12/2008 | Schulz | H01L 29/66795 257/365 |
| 2013/0217226 A1 | 8/2013 | Kitamura et al. | |
| 2013/0309838 A1* | 11/2013 | Wei | H01L 21/76229 438/424 |
| 2014/0015015 A1 | 1/2014 | Krivokapic et al. | |
| 2016/0093614 A1* | 3/2016 | Cheng | H01L 27/0886 257/401 |
| 2016/0118463 A1 | 4/2016 | Cheng et al. | |
| 2016/0118479 A1 | 4/2016 | Chang et al. | |
| 2017/0294516 A1 | 10/2017 | Zhang et al. | |
| 2018/0166443 A1* | 6/2018 | Kim | H01L 21/82345 |

OTHER PUBLICATIONS

International Search Report and Written Opinion—PCT/US2018/033405—ISA/EPO—dated Sep. 6, 2018.

* cited by examiner

TRANSISTOR WITH LOW RESISTIVITY CARBON ALLOY

CROSS-REFERENCE TO RELATED APPLICATION

The present application claims the benefit of U.S. Provisional Patent Application No. 62/511,795, filed on May 26, 2017, and titled "TRANSISTOR WITH LOW RESISTIVITY CARBON ALLOY," the disclosure of which is expressly incorporated by reference herein in its entirety.

BACKGROUND

Field

Aspects of the present disclosure relate to semiconductor devices and, more particularly, to a gate fill material for devices such as transistors.

Background

As integrated circuit (IC) technology advances, device geometries are reduced. Reducing the geometry and "pitch" (spacing) between devices may cause devices to interfere with each other and adversely affect operation.

Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) is also a three-dimensional structure on the surface of a semiconductor substrate. A nanowire FET includes doped portions of the nanowire that contact a channel region and serve as the source and drain regions of the device. A nanowire FET is also an example of a MOSFET device.

The performance of MOSFET devices can be affected by numerous factors including channel length, strain, and external resistance. Additionally, gate resistance and contact parasitic capacitance of source/drain contacts can substantially reduce chip speed (e.g., >10%) in advanced complementary metal-oxide-semiconductor (CMOS) processes.

SUMMARY

A complementary metal-oxide-semiconductor (CMOS) transistor may include a first semiconductor structure and a gate stack on the first semiconductor structure. The gate stack may include a gate dielectric layer on the first semiconductor structure, a work function material on the gate dielectric layer, and a gate metal fill material on the work function material of the gate stack. The gate metal fill material may include a low resistivity carbon alloy. A dielectric fill material may be included on the gate stack.

A complementary metal-oxide-semiconductor (CMOS) transistor may include a first semiconductor structure and a gate stack on the first semiconductor structure. The gate stack may include a gate dielectric layer on the first semiconductor structure, a work function material on the gate dielectric layer, and a gate metal fill material on the work function material of the gate stack. The gate metal fill material may include a low resistivity carbon alloy. Means for insulating may be included on the gate stack.

A method of fabricating a complementary metal-oxide-semiconductor (CMOS) transistor may include depositing a dielectric layer on a structure supported by a semiconductor substrate. The method may further include depositing a work function material layer on the dielectric layer. The method may also include depositing a low resistivity carbon alloy on the work function material layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
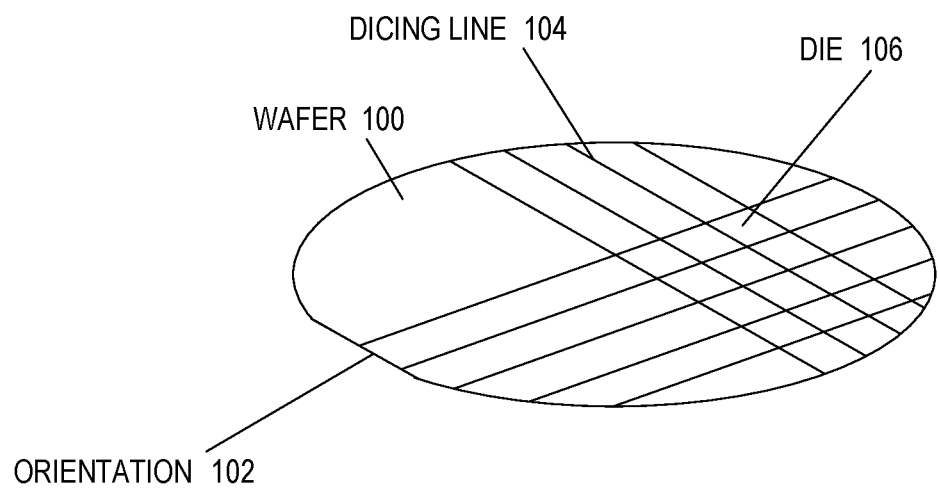
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Semiconductor fabrication processes are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process includes gate and terminal contact formation. Back-end-of-line processes include forming interconnects and dielectric layers for coupling to the FEOL devices. The gate and terminal contact formation of the middle-of-line (MOL) process, however, is an increasingly challenging part of the fabrication flow as a result of increased gate resistance due to a relatively high resistivity (Rgate) of conventional gate fill material (e.g., tungsten (W)).

Fin-based devices represent a significant advance in IC technology over planar-based devices. Fin-based devices are three-dimensional structures on the surface of a semiconductor substrate. A FinFET transistor is a fin-based metal-oxide-semiconductor field-effect transistor (MOSFET). A nanowire field-effect transistor (FET) also represents a significant advance in IC technology. A gate-all-around (GAA) nanowire-based device is also a three-dimensional structure on the surface of a semiconductor substrate. A GAA nanowire-based device includes doped portions of the nanowire that contact a channel region and serve as the source and drain regions of the device. A GAA nanowire-based device is also an example of a MOSFET device.

In addition to gate resistance, contact parasitic capacitance (Cpc) of source/drain contacts (CA) at the MOL layer (e.g., Cpc-ca) may be high in FinFET transistors. In particular, gate resistance (Rgate) and contact parasitic capacitance (Cpc-ca) are important factors for determining chip performance, such as chip speed. Having a high gate resistance (Rgate) or a high CA contact parasitic capacitance (Cpc-ca) can substantially reduce chip speed (e.g., >10%) in advanced complementary metal-oxide-semiconductor (CMOS) processes.

According to aspects of the present disclosure, a CMOS transistor is described in which a gate fill material of a gate stack is replaced by a dielectric fill material, and a low resistivity carbon alloy is deposited on the work function material of the gate stack in place of a conventional gate fill material. The low resistivity carbon alloy may be composed of a single layer of graphene or a multilayer of graphene. For example, the low resistivity carbon alloy may be ~0.3 to ~30 nanometers (nm) thick.

Various aspects of the disclosure provide techniques for reducing a gate resistance (Rgate) and/or a contact parasitic capacitance (Cpc-ca) of a CMOS transistor. The process flow for reducing the gate resistance or the contact parasitic capacitance may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably unless such interchanging would tax credulity.

Aspects of the present disclosure include an innovative gate stack that reduces a gate resistance (Rgate) and/or a CA contact parasitic capacitance (Cpc-ca) of a CMOS transistor. The innovative gate stack may include a gate dielectric deposited on a semiconductor fin, a work function material deposited on the gate dielectric, and a low resistivity carbon alloy (e.g., graphene) deposited on the work function material. For example, the low resistivity carbon alloy may be 1 to 10 nm thick, and may be single layered or multilayered. A dielectric layer is then deposited over the low resistivity carbon alloy. The low resistivity carbon alloy replaces a conventional gate fill material (e.g., tungsten (W)). The innovative gate stack offers advantages of reduced gate resistance (e.g., three times lower) and contact parasitic capacitance (e.g., three times lower).

According to an aspect of the present disclosure, the work function material may include a first TiN (titanium nitride) layer on the gate dielectric layer, a TaN (tantalum nitride) layer on the TiN layer, a TiAlC (titanium aluminum carbon) layer on the TaN layer, and a second TiN layer on the TiAlC layer.

According to aspects of the present disclosure, the low resistivity carbon alloy may be fabricated using chemical vapor deposition (CVD) on a sacrificial catalyst layer. Alternatively, the low resistivity carbon alloy may be fabricated by decomposition of atmospheric pressure CVD (APCVD) carbonaceous precursors. Other processes may also be utilized to fabricate the low resistivity carbon alloy.

According to additional aspects of the present disclosure, the CMOS transistor may be a planar transistor structure or a gate all around (GAA) transistor structure. For example, a gate dielectric is deposited on a silicon body/channel, a work function material is deposited on the gate dielectric, and a low resistivity carbon alloy (e.g., graphene) is deposited on the work function material. A dielectric layer may be deposited over the low resistivity carbon alloy.

According to additional aspects of the present disclosure, a planar transistor may include a metal gate or polysilicon gate. For example, a carbon alloy (e.g., single or multiple layer graphene) may be used as a gate fill material. Using the carbon alloy to completely or partially replace tungsten (W) or nickel silicide (NiSi) for the planar device would improve the device gate resistance (Rgate) and/or contact parasitic capacitance (Cpc) of source/drain contacts (CA).

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a single material (e.g., silicon) or a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
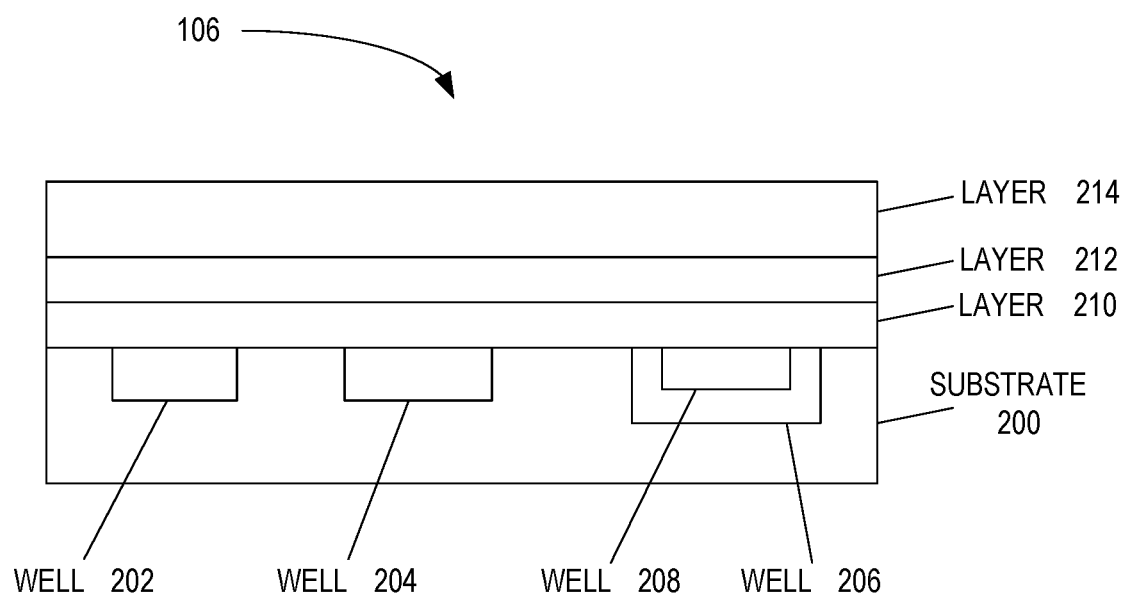
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204 of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
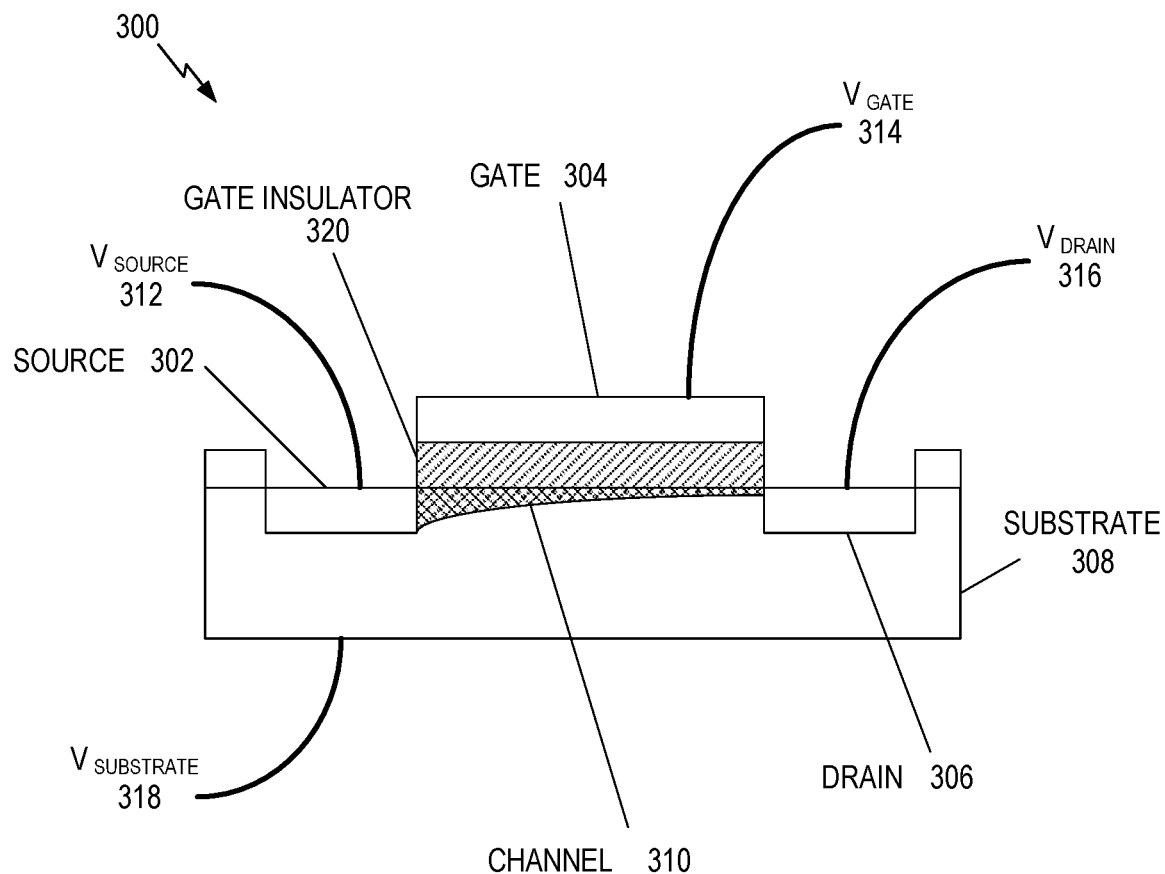
FIG. 3 illustrates a cross-sectional view of a metal-oxide-semiconductor field-effect transistor (MOSFET) device.
Figure 3:
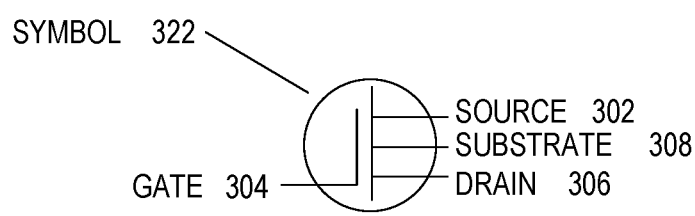

FIG. 3 illustrates a cross-sectional view of a metal-oxide-semiconductor field-effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304, as described below.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
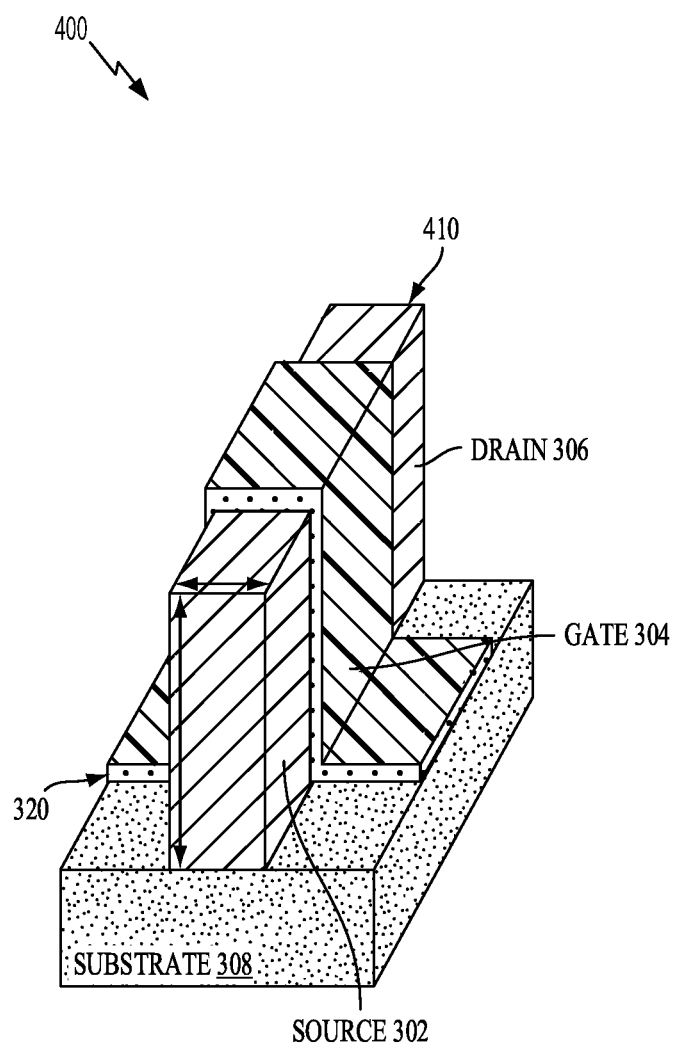
FIG. 4 illustrates a fin field-effect transistor (FinFET).

FIG. 4 illustrates a fin-structured FET (FinFET 400) that operates in a similar fashion to the MOSFET device 300 described with respect to FIG. 3. According to aspects of the present disclosure, the FinFET 400 may include a low resistivity carbon alloy as described in more detail below. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. In a FinFET structure, the physical size of the FinFET 400 may be smaller than the MOSFET device 300 structure shown in FIG. 3. This reduction in physical size allows for more devices per unit area on the die 106.

The FinFET 400 may be fabricated through processes including a front-end-of-line (FEOL), a middle-of-line (MOL) and a back-end-of-line (BEOL). A middle-of-line process includes gate and terminal contact formation. A middle-of-line layer trench contacts the source and drain regions of the FinFET 400 and is referred to as CA contacts. A parasitic capacitance between the CA contacts and a gate fill material is referred to as a CA contact parasitic capacitance (Cpc-CA).

Although the FinFET 400 may represent a significant advance in IC technology over planar-based devices, contact parasitic capacitance is a problem for FinFET transistors. In particular, the contact parasitic capacitance (Cpc) between the source/drain trench (CA) contacts at the middle-of-line layer (e.g., Cpc-CA) of the gate metal may be high in fin-based devices, such as in the FinFET 400.

The combination of the gate resistance (Rgate) and the CA contact parasitic capacitance (Cpc-CA) is an important factor for determining chip performance, such as chip speed. Having a high gate resistance (Rgate) or a high CA contact parasitic capacitance (Cpc-CA) can substantially reduce chip speed (e.g., >10%) in advanced complementary metal-oxide-semiconductor (CMOS) processes.

Aspects of the present disclosure include an innovative complementary metal-oxide-semiconductor (CMOS) transistor that includes a first semiconductor structure (e.g., a first fin) and a gate stack on the first semiconductor structure.

The gate stack may include a gate dielectric layer on the first semiconductor structure, a work function material on the gate dielectric layer, a low resistivity carbon alloy on the work function material of the gate stack, and a dielectric fill material on the gate stack in place of a gate fill material.

According to aspects of the present disclosure, the CMOS transistor may further include a second semiconductor structure (e.g., a second fin) directly adjacent to the first semiconductor structure. The gate stack may be included on the second semiconductor structure such that the work function material is on the dielectric layer of the gate stack, and the dielectric film material is directly between the first semiconductor structure and the second semiconductor structure.

According to additional aspects of the present disclosure, the CMOS transistor may further comprise a semiconductor substrate supporting the first semiconductor structure and the second semiconductor structure. For example, the gate stack is on a surface of the semiconductor substrate, between the first semiconductor structure and the second semiconductor structure. Additionally, the CMOS transistor may be a planar transistor or a gate all around (GAA) transistor.

By replacing a conventional gate fill material with the low resistivity carbon alloy, a gate resistance is reduced because the thickness of the low resistivity carbon alloy is lower than that of the conventional gate fill material. Additionally, a contact parasitic capacitance is effectively eliminated because the dielectric film material is deposited between each fin and the low resistivity carbon alloy does not impact other active areas. As such, device and chip performance are substantially improved.

Figure 5:
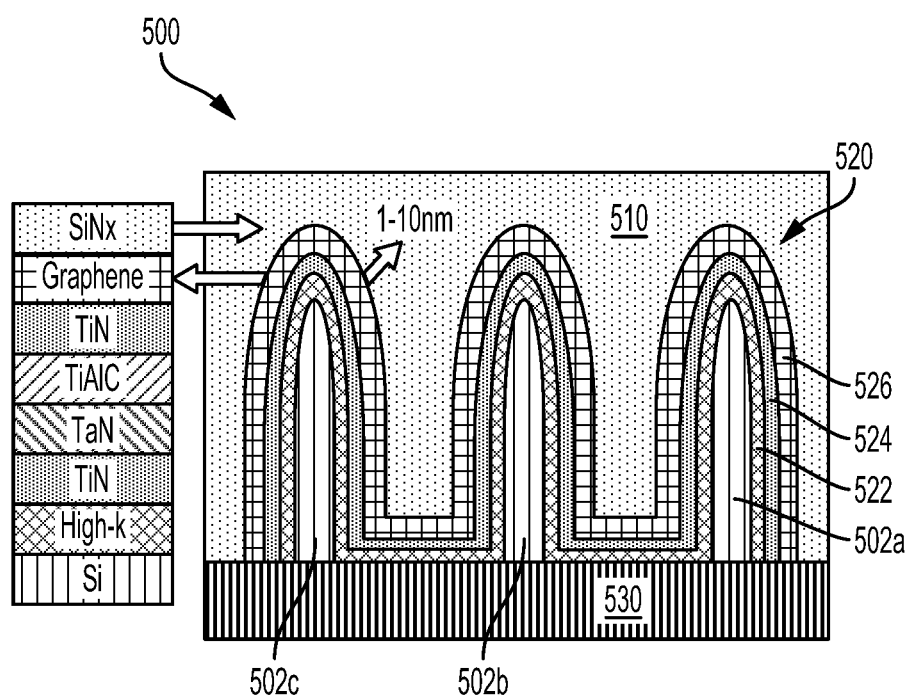
FIG. 5 illustrates a transistor with a low resistivity carbon alloy according to aspects of the present disclosure.

FIG. 5 illustrates a transistor 500 (e.g., a CMOS transistor) having a first semiconductor structure 502a with a gate stack 520 including a low resistivity carbon alloy 526 according to aspects of the present disclosure. The gate stack 520 may include a dielectric layer 522, a work function material 524, and the low resistivity carbon alloy 526. According to an aspect, a gate metal fill material may include the low resistivity carbon alloy 526. Additionally, the first semiconductor structure 502a may be a silicon fin. The dielectric layer 522 (e.g., a high-K gate dielectric) may be deposited over the first semiconductor structure 502a. For example, the dielectric layer 522 may be a high-K dielectric.

According to aspects of the present disclosure, the work function material 524 may be deposited over the dielectric layer 522. For example, the work function material 524 may include a first TiN layer on the dielectric layer 522, a TaN layer on the first TiN layer, a TiAlC layer on the TaN layer, and a second TiN layer on the TiAlC layer. This arrangement of layers is exemplary, however, and other combinations of work function material layers are possible.

According to an aspect of the present disclosure, the low resistivity carbon alloy 526 may be deposited over the work function material 524. For example, the low resistivity carbon alloy 526 may include graphene, and may be in the range of 0.3 nm to 30 nm thick. Additionally, the low resistivity carbon alloy 526 may include a single layer of graphene or a multilayer of graphene, and may be in the range of 0.3 nm to 30 nm thick.

According to an aspect of the present disclosure, a second semiconductor structure 502b may be directly adjacent to the first semiconductor structure 502a. The second semiconductor structure 502b may also be a fin, and may include the gate stack 520 on the fin. For example, the gate stack 520 may be arranged on the second semiconductor structure 502b as described above.

According to additional aspects of the present disclosure, a dielectric fill material 510 may be deposited over the low resistivity carbon alloy 526. The dielectric fill material 510 may also be directly between the first semiconductor structure 502a and the second semiconductor structure 502b.

According to aspects of the present disclosure, the transistor 500 may further include a semiconductor substrate 530 supporting at least the first semiconductor structure 502a, the second semiconductor structure 502b, and a third semiconductor structure 502c. For example, the gate stack 520 may be on a surface of the semiconductor substrate 530, between the first semiconductor structure 502a and the second semiconductor structure 502b. The first semiconductor structure 502a, the second semiconductor structure 502b, and the third semiconductor structure 502c may be grown, deposited, or otherwise fabricated on the semiconductor substrate 530.

Although three semiconductor structures (e.g., 502a-502c) are shown, it is understood that this is exemplary, and more or fewer semiconductor structures are possible. The configuration as described above also applies to the third semiconductor structure 502c as well.

Figure 6A:
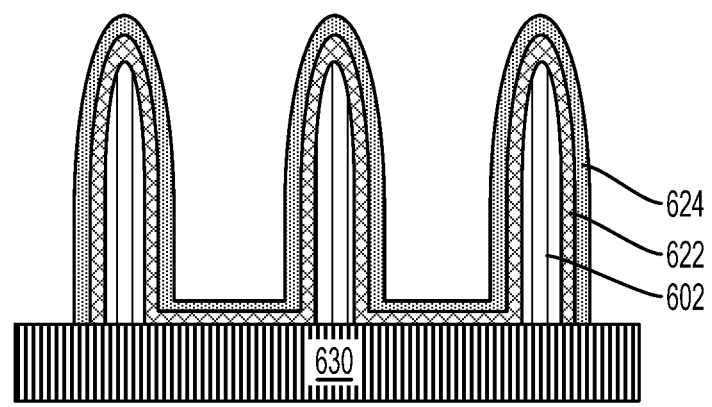
FIGS. 6A-6C illustrate a process for fabricating a transistor with a low resistivity carbon alloy according to aspects of the present disclosure.
Figure 6B:
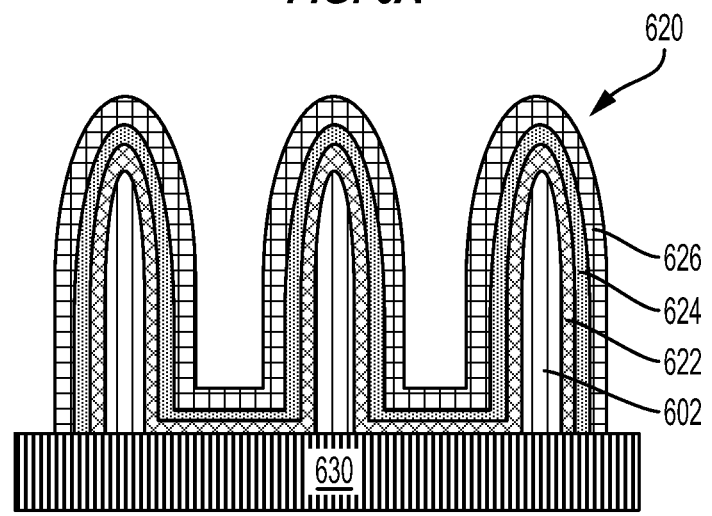
Figure 6C:
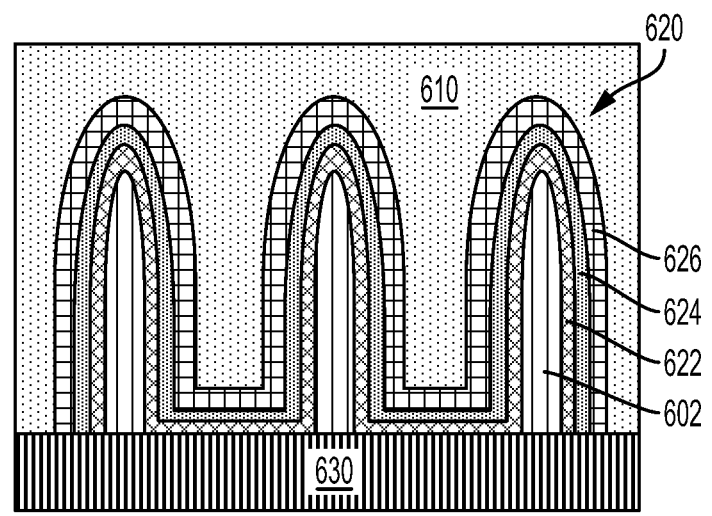

FIGS. 6A-6C illustrate a process for fabricating a transistor (e.g., a CMOS transistor) with a low resistivity carbon alloy according to aspects of the present disclosure.

FIG. 6A illustrates semiconductor structures 602 with a dielectric layer 622 deposited over the semiconductor structures 602, and a work function material 624 deposited over the dielectric layer 622. The dielectric layer 622 may include a high-K gate dielectric. According to an aspect, the semiconductor structures 602 may be fabricated (e.g., epitaxially grown or deposited) on a semiconductor substrate 630. Additionally, the semiconductor structures 602 may be fins.

According to aspects of the present disclosure, the work function material 624 may include a first TiN layer on the dielectric layer 622, a TaN layer on the first TiN layer, a TiAlC layer on the TaN layer, and a second TiN layer on the TiAlC layer. This arrangement of layers is exemplary, however, and other combinations of work function material layers are possible.

FIG. 6B illustrates a low resistivity carbon alloy 626 deposited over the work function material 624. According to an aspect, a gate metal fill material may include the low resistivity carbon alloy 626. For example, the low resistivity carbon alloy 626 may include a single layer of graphene or multiple layers (a multilayer) of graphene, and may also be in the range of 0.3 nm to 30 nm thick.

According to aspects of the present disclosure, the low resistivity carbon alloy 626 may be fabricated using chemical vapor deposition (CVD) on a sacrificial catalyst layer. Alternatively, the low resistivity carbon alloy 626 may be fabricated by decomposition of atmospheric pressure CVD (APCVD) carbonaceous precursors. Other processes may also be used to fabricate the low resistivity carbon alloy 626.

According to aspects of the present disclosure, a gate stack 620 may include the dielectric layer 622, the work function material 624, and the low resistivity carbon alloy 626. Additionally, the gate stack 620 may be on a surface of the semiconductor substrate 630, between each of the semiconductor structures 602.

FIG. 6C illustrates a dielectric fill material 610 deposited over the low resistivity carbon alloy 626. The dielectric fill material 610 may also be directly between each of the semiconductor structures 602.

Although three semiconductor structures 602 are shown, it is understood that this is exemplary only, and the process described above may also apply to more or fewer semiconductor structures.

Figure 7:
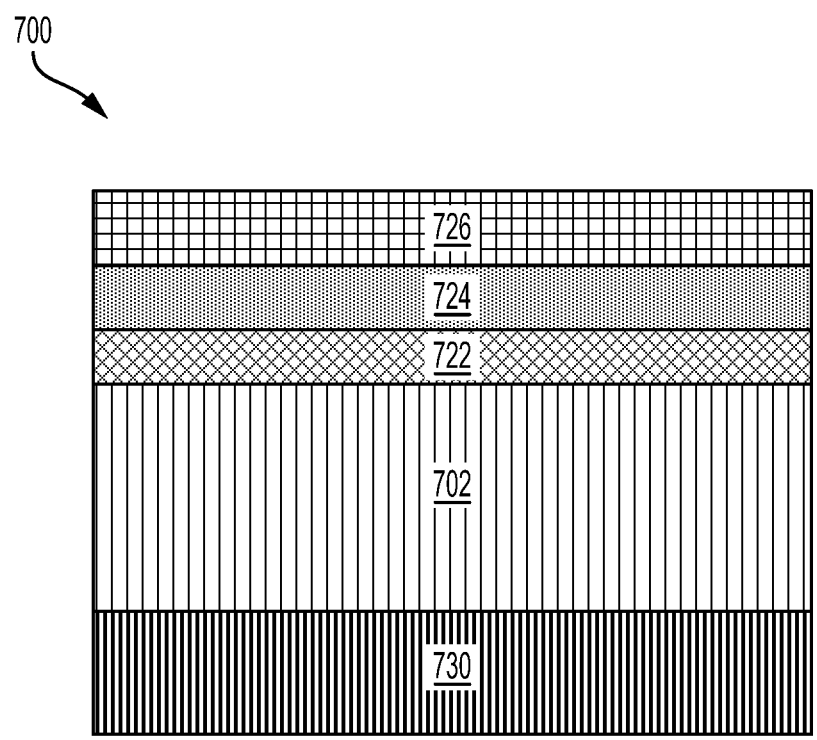
FIG. 7 illustrates a planar transistor including a low resistivity carbon alloy according to aspects of the present disclosure.

FIG. 7 illustrates a planar transistor 700 (e.g., for a CMOS transistor) including a low resistivity carbon alloy 726 according to aspects of the present disclosure. For example, the low resistivity carbon alloy 726 may be deposited over a work function material 724. The work function material 724 may be deposited over a dielectric layer 722 (e.g., a high-K gate dielectric). The dielectric layer 722 may be deposited over a semiconductor structure 702. A gate metal fill material may include the low resistivity carbon alloy 726.

According to aspects of the present disclosure, the low resistivity carbon alloy 726 may include a single layer of graphene or a multilayer of graphene, and may also be in the range of 0.3 nm to 30 nm thick.

In accordance with aspects of the present disclosure, the work function material 724 may also include a first TiN layer on the dielectric layer 722, a TaN layer on the first TiN layer, a TiAlC layer on the TaN layer, and a second TiN layer on the TiAlC layer. This arrangement of layers is exemplary, however, and other combinations of work function material layers are possible.

According to additional aspects of the present disclosure, the planar transistor 700 may be fabricated on a semiconductor substrate 730. Additionally, a dielectric fill material (not shown) may be deposited over the low resistivity carbon alloy 726.

Figure 8:
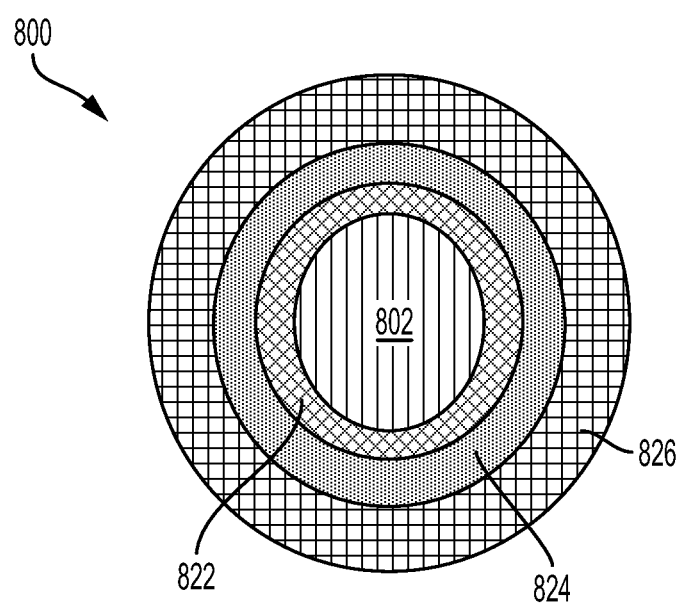
FIG. 8 illustrates a gate all around (GAA) transistor including a low resistivity carbon alloy according to aspects of the present disclosure.

FIG. 8 illustrates a gate all around (GAA) transistor 800 (e.g., for a CMOS transistor) including a low resistivity carbon alloy 826 according to aspects of the present disclosure. For example, the low resistivity carbon alloy 826 may be deposited around a work function material 824. The work function material 824 may be deposited around a dielectric layer 822 (e.g., a high-K gate dielectric). The dielectric layer 822 may be deposited around a circular semiconductor structure 802.

According to aspects of the present disclosure, the low resistivity carbon alloy 826 may also include a single layer of graphene or a multilayer of graphene, and may also be in the range of 0.3 nm to 30 nm thick. Additionally, a gate metal fill material may include the low resistivity carbon alloy 826.

In accordance with aspects of the present disclosure, the work function material 824 may also include a first TiN layer on the dielectric layer 822, a TaN layer on the first TiN layer, a TiAlC layer on the TaN layer, and a second TiN layer on the TiAlC layer. This arrangement of layers is exemplary, however, and other combinations of work function material layers are possible.

According to additional aspects of the present disclosure, the transistor 800 may be fabricated around a semiconductor substrate (not shown). A dielectric fill material (not shown) may also be deposited around the low resistivity carbon alloy 826.

In accordance with aspects of the present disclosure, work function materials and thicknesses may vary between different types of transistors (e.g., fin, planar, GAA, etc.), and also in different transistors having the same structure. For example, an N-type transistor (e.g., fin, planar, GAA, etc.) may include different work function materials and different thicknesses from a P-type transistor (e.g., fin, planar, GAA, etc.). The carbon alloy may be deposited on the work function material as described herein.

Figure 9:
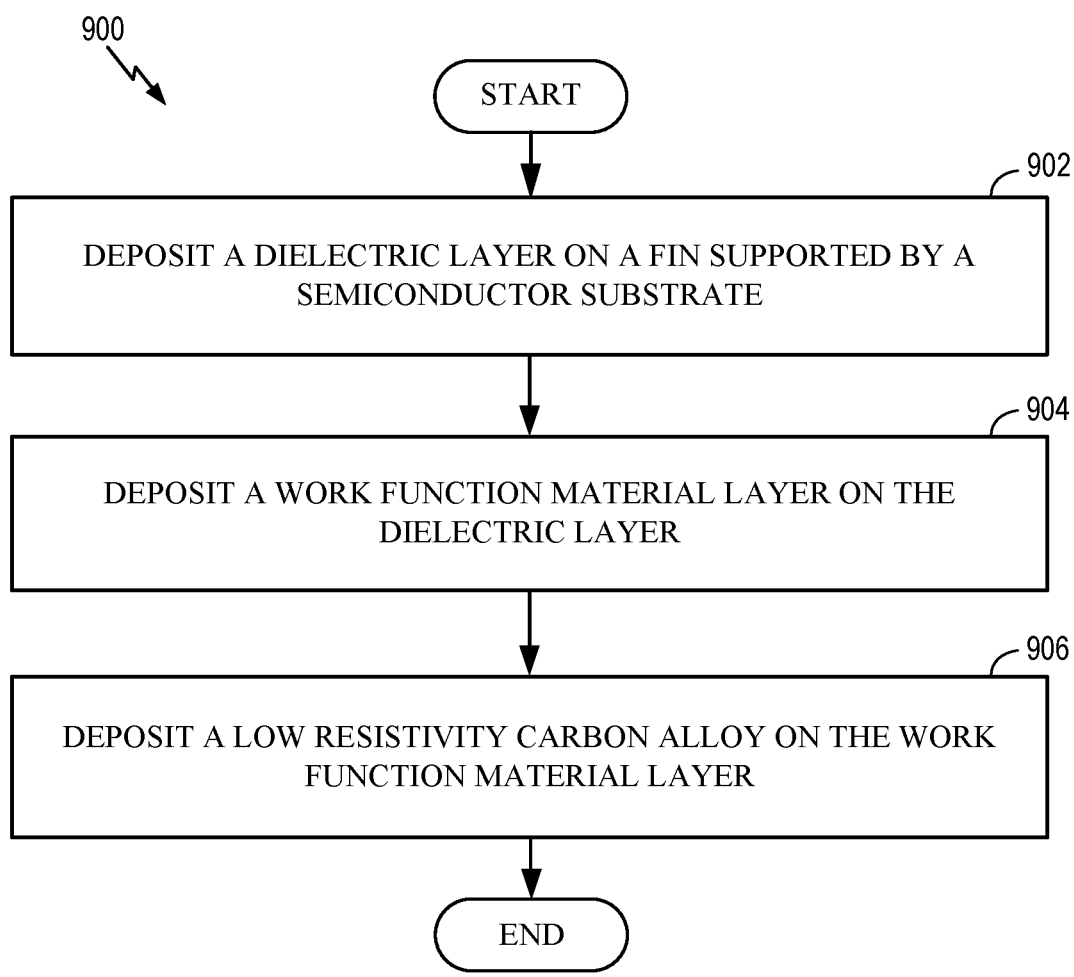
FIG. 9 illustrates a method for fabricating a transistor with a low resistivity carbon alloy according to aspects of the present disclosure.

FIG. 9 is a process flow diagram illustrating a method 900 of fabricating a transistor (e.g., a CMOS transistor) including a low resistivity carbon alloy according to aspects of the present disclosure. The method 900 may begin with fins grown/deposited on a semiconductor substrate. For example, FIG. 6A illustrates a pattern of semiconductor (e.g., silicon (Si)) fins (e.g., semiconductor structures 602) epitaxially grown/deposited on a semiconductor substrate 630.

At block 902, a dielectric layer is deposited on the fin. For example, FIG. 6A illustrates that a dielectric layer 622 is deposited on the fins. The dielectric layer 622 may be a high-K gate dielectric.

At block 904, a work function material is deposited on the dielectric layer. For example, FIG. 6A illustrates a work function material 624 deposited over the dielectric layer 622. The work function material 624 may include a first TiN (titanium nitride) layer on the dielectric layer 622, a TaN (tantalum nitride) layer on the TiN layer, a TiAlC (titanium aluminum carbon) layer on the TaN layer, and a second TiN layer on the TiAlC layer.

At bock 906, a low resistivity carbon alloy is deposited on the work function material layer. For example, FIG. 6B illustrates a low resistivity carbon alloy 626 deposited on the work function material 624.

According to an aspect of the present disclosure, the low resistivity carbon alloy 626 may be fabricated using chemical vapor deposition (CVD) on a sacrificial catalyst layer. For example, the sacrificial catalyst layer is first deposited on the work function material 624. The low resistivity carbon alloy 626 is then diffused through the sacrificial catalyst layer. The sacrificial catalyst layer is removed to complete the process.

Alternatively, the low resistivity carbon alloy 626 may be fabricated by decomposition of atmospheric pressure CVD (APCVD) carbonaceous precursors. For example, a thin catalyst layer is deposited over the work function material 624, and carbonaceous precursors are decomposed to deposit a layer of the low resistivity carbon alloy 626. Other processes may also be used to fabricate the low resistivity carbon alloy 626.

According to aspects of the present disclosure, the transistor may include a planar transistor structure or a gate all around (GAA) transistor structure, as shown in FIGS. 7 and 8. For example, a gate dielectric is deposited on a silicon body/channel, a work function material is deposited on the gate dielectric, and a low resistivity carbon alloy (e.g., graphene) is deposited on the work function material. A dielectric layer may be deposited over the low resistivity carbon alloy.

According to additional aspects of the present disclosure, a planar transistor may include a metal gate or polysilicon gate. Additionally, a carbon alloy (e.g., single or multiple layer graphene) may be used as gate fill material. Using the carbon alloy to completely or partially replace tungsten (W) or nickel silicide (NiSi) for the planar device would improve the device gate resistance (Rgate) and/or contact parasitic capacitance (Cpc) of source/drain contacts (CA).

According to an aspect of the present disclosure, a complementary metal-oxide-semiconductor (CMOS) transistor including a low resistivity carbon alloy is described. In one configuration, the CMOS transistor includes means for insulating. The means for insulating may be a dielectric fill material. In another aspect, the aforementioned means may be any module or any apparatus or material configured to perform the functions recited by the aforementioned means.

Figure 10:
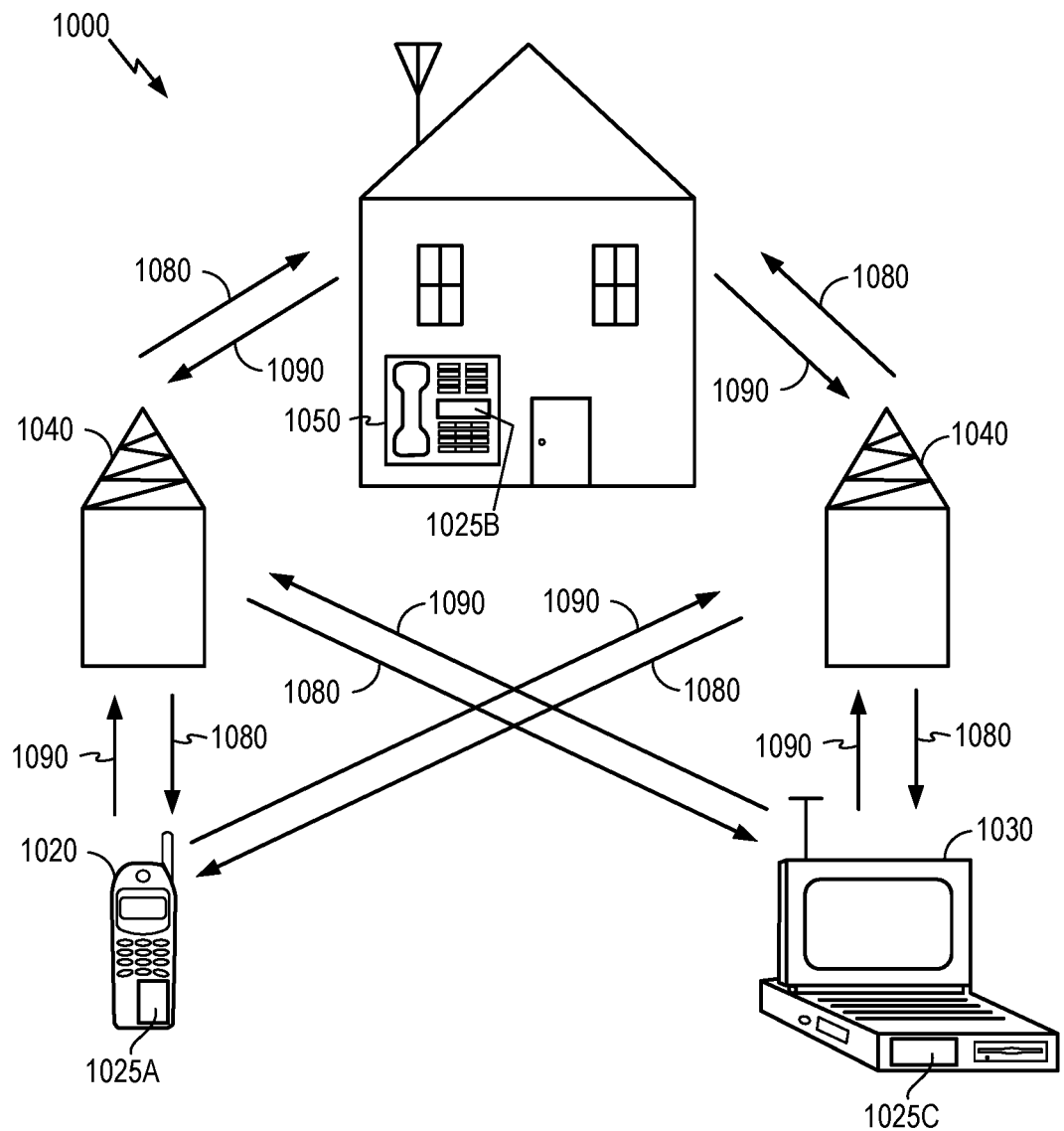
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed transistors. It will be recognized that other devices may also include the disclosed transistors, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed transistors.

Figure 11:
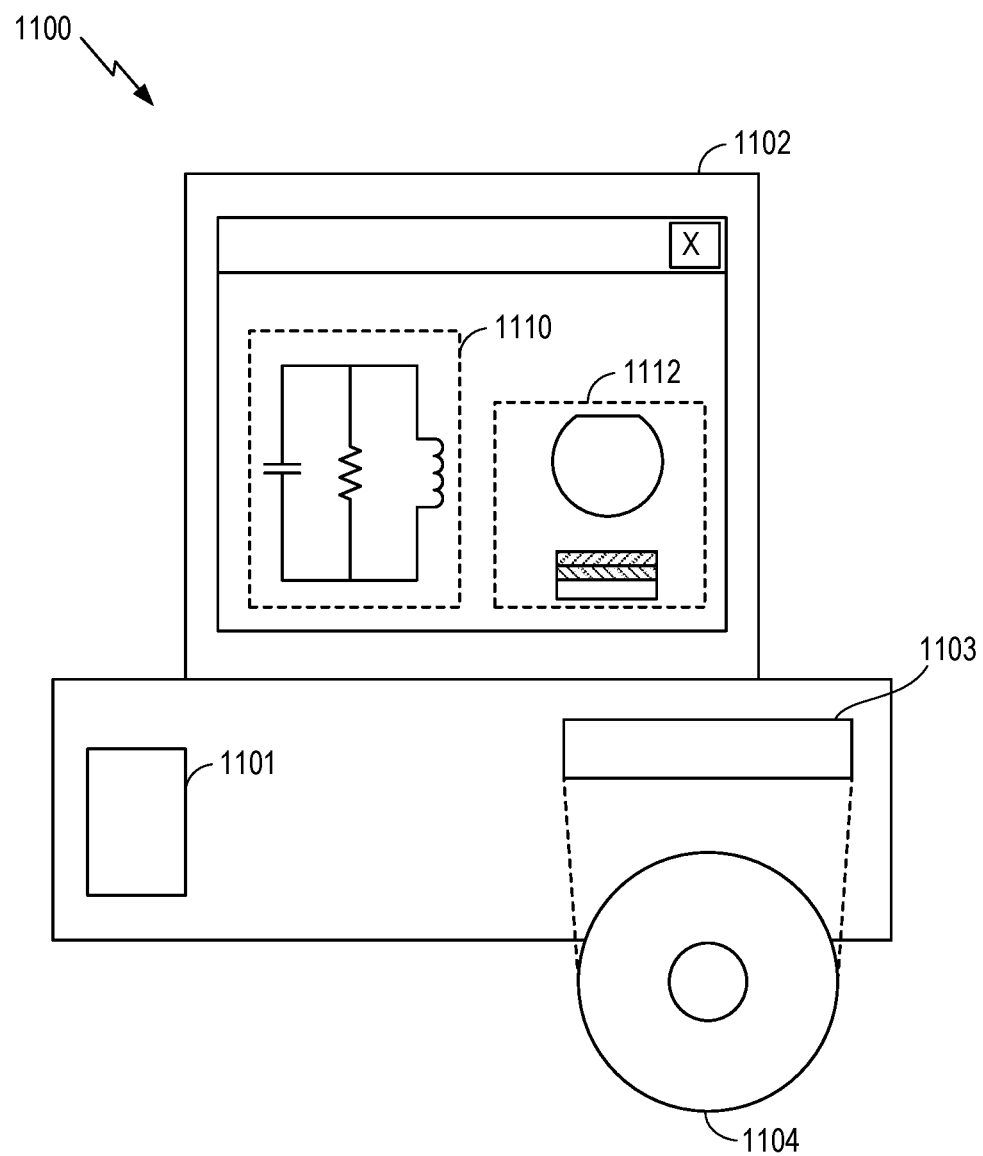
FIG. 11 is a block diagram illustrating a design workstation used for circuit, layout, and logic design of a transistor structure according to one configuration.

FIG. 11 is a block diagram illustrating a design workstation used for circuit, layout, and logic design of an IC structure, such as the transistors disclosed above. A design workstation 1100 includes a hard disk 1101 containing operating system software, support files, and design software such as Cadence or OrCAD. The design workstation 1100 also includes a display 1102 to facilitate design of a circuit 1110 or a fin-based structure 1112 including a CMOS transistor. A storage medium 1104 is provided for tangibly storing the design of the circuit 1110 or the fin-based structure 1112. The design of the circuit 1110 or the fin-based structure 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the fin-based structure 1112 by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A complementary metal-oxide-semiconductor (CMOS) transistor, comprising:
    a semiconductor substrate;
    a first semiconductor structure on the semiconductor substrate;
    a gate stack on the first semiconductor structure, the gate stack comprising:
        a gate dielectric layer on the first semiconductor structure,
        a work function material on the gate dielectric layer, and
        a gate metal layer material comprising a low resistivity carbon alloy on the work function material of the gate stack;
    a second semiconductor structure on the semiconductor substrate and directly adjacent to the first semiconductor structure, the second semiconductor structure including the gate stack on the second semiconductor structure, and the gate stack on a surface of the semiconductor substrate and extending continuously across an entire length of the surface between the first semiconductor structure and the second semiconductor structure; and
    a dielectric fill material on the gate stack.

2. The CMOS transistor of claim 1, in which the dielectric fill material is directly between the first semiconductor structure and the second semiconductor structure.

3. The CMOS transistor of claim 1, in which the second semiconductor structure comprises a second fin.

4. The CMOS transistor of claim 1, in which the low resistivity carbon alloy comprises a single layer of graphene or a multilayer of graphene.

5. The CMOS transistor of claim 1, in which the low resistivity carbon alloy is 0.3 to 30 nm thick.

6. The CMOS transistor of claim 1, in which the work function material comprises:
    a first TiN layer on the gate dielectric layer;
    a TaN layer on the first TiN layer;
    a TiAlC layer on the TaN layer; and
    a second TiN layer on the TiAlC layer.

7. The CMOS transistor of claim 1, in which the gate dielectric layer comprises a high-k gate dielectric.

8. The CMOS transistor of claim 1, in which the first semiconductor structure comprises a first fin.

9. The CMOS transistor of claim 1, in which the CMOS transistor comprises a planar transistor structure or a gate all around (GAA) transistor structure.

10. The CMOS transistor of claim 1, integrated into a mobile phone, a set top box, a music player, a video player, an entertainment unit, a navigation device, a computer, a hand-held personal communication systems (PCS) unit, a portable data unit, and/or a fixed location data unit.

11. The CMOS transistor of claim 1, in which a portion of the gate stack on the first semiconductor structure comprises a rounded shape distal from the surface of the semiconductor substrate.

12. The CMOS transistor of claim 11, in which a portion of the gate stack on the second semiconductor structure comprises a rounded shape distal from the surface of the semiconductor substrate.

13. A complementary metal-oxide-semiconductor (CMOS) transistor, comprising:
    a semiconductor substrate;
    a first semiconductor structure on the semiconductor substrate;

a gate stack on the first semiconductor structure, the gate stack comprising:
- a gate dielectric layer on the first semiconductor structure,
- a work function material on the gate dielectric layer, and
- a gate metal layer material comprising a low resistivity carbon alloy on the work function material of the gate stack;

a second semiconductor structure on the semiconductor substrate and directly adjacent to the first semiconductor structure, the second semiconductor structure including the gate stack on the second semiconductor structure, and the gate stack on a surface of the semiconductor substrate and extending continuously across an entire length of the surface between the first semiconductor structure and the second semiconductor structure; and a dielectric fill material on the gate stack.

14. The CMOS transistor of claim 13, in which the dielectric fill material is directly between the first semiconductor structure and the second semiconductor structure.

15. The CMOS transistor of claim 13, in which the low resistivity carbon alloy comprises a single layer of graphene or a multilayer of graphene.

16. The CMOS transistor of claim 13, in which the low resistivity carbon alloy is 0.3 to 30 nm thick.

17. The CMOS transistor of claim 13, in which the work function material comprises:
- a first TiN layer on the gate dielectric layer;
- a TaN layer on the first TiN layer;
- a TiAlC layer on the TaN layer; and
- a second TiN layer on the TiAlC layer.

18. The CMOS transistor of claim 13, in which the gate dielectric layer comprises a high-k gate dielectric.

19. The CMOS transistor of claim 13, in which the first semiconductor structure comprises a first fin.

20. The CMOS transistor of claim 13, in which the CMOS transistor comprises a planar transistor structure or a gate all around (GAA) transistor structure.

21. The CMOS transistor of claim 13, integrated into a mobile phone, a set top box, a music player, a video player, an entertainment unit, a navigation device, a computer, a hand-held personal communication systems (PCS) unit, a portable data unit, and/or a fixed location data unit.

22. A method of fabricating a complementary metal-oxide-semiconductor (CMOS) transistor, comprising:
- depositing a dielectric layer on a first semiconductor structure and a second semiconductor structure and on a surface of a semiconductor substrate between the first semiconductor structure and the second semiconductor structure, each supported by the semiconductor substrate;
- depositing a work function material layer on the dielectric layer of the first semiconductor structure, the second semiconductor structure, and the surface of the semiconductor substrate;
- depositing a low resistivity carbon alloy on the work function material layer of the first semiconductor structure, the second semiconductor structure, and on the surface of the semiconductor substrate to form a gate stack including the dielectric layer, the work function material layer and the low resistivity carbon alloy, the gate stack on a surface of the semiconductor structure and extending continuously across the entire length of the surface between the first semiconductor structure and the second semiconductor structure; and
- depositing a dielectric fill material on the low resistivity carbon alloy of the first semiconductor structure, the second semiconductor structure, and the surface of the semiconductor substrate.

23. The method of claim 22, in which the depositing the low resistivity carbon alloy comprises:
- depositing a sacrificial catalyst layer;
- diffusing the low resistivity carbon alloy through the sacrificial catalyst layer; and
- removing the sacrificial catalyst layer.

24. The method of claim 22, in which the depositing the low resistivity carbon alloy comprises:
- depositing a thin catalyst layer; and
- decomposing carbonaceous precursors.

25. The method of claim 22, in which depositing the low resistivity carbon alloy comprises depositing a single layer of graphene or depositing a multilayer of graphene.

26. The method of claim 22, in which the CMOS transistor is integrated into a mobile phone, a set top box, a music player, a video player, an entertainment unit, a navigation device, a computer, a hand-held personal communication systems (PCS) unit, a portable data unit, and/or a fixed location data unit.

* * * * *